United States Patent
Cannon et al.

(10) Patent No.: US 7,400,661 B2
(45) Date of Patent: Jul. 15, 2008

(54) AUTOMATIC SETTING OF LASER DIODE BIAS CURRENT

(75) Inventors: Roger Steven Cannon, Nicholasville, KY (US); Daniel Richard Klemer, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 11/557,557

(22) Filed: Nov. 8, 2006

(65) Prior Publication Data

US 2008/0123702 A1    May 29, 2008

(51) Int. Cl.
*H01S 3/00*    (2006.01)
(52) U.S. Cl. .............................. 372/38.01; 372/29.011
(58) Field of Classification Search ............ 372/29.021, 372/22, 27, 49, 32, 29.011
See application file for complete search history.

(56) References Cited

U.S. PATENT DOCUMENTS

| | | | | |
|---|---|---|---|---|
| 4,983,034 A * | 1/1991 | Spillman, Jr. ................ 356/32 | | |
| 4,994,663 A | 2/1991 | Aoshima et al. | | |
| 5,150,242 A * | 9/1992 | Fellows ...................... 359/108 | | |
| 5,394,415 A * | 2/1995 | Zucker et al. .................. 372/26 | | |
| 5,659,560 A * | 8/1997 | Ouchi et al. ................... 372/27 | | |
| 6,639,931 B1 | 10/2003 | Dowd et al. | | |
| 2002/0048291 A1 | 4/2002 | Koyanagi | | |
| 2005/0084202 A1* | 4/2005 | Smith et al. ................... 385/14 | | |
| 2007/0053395 A1* | 3/2007 | Kamatani et al. ........ 372/38.02 | | |

* cited by examiner

*Primary Examiner*—Minsun Harvey
*Assistant Examiner*—Tuan N. Nguyen
(74) *Attorney, Agent, or Firm*—Coats & Bennett PLLC (57) ABSTRACT

Threshold current may be determined and one or more bias sources may be programmed in a laser drive circuit. For example, a laser diode emits light along first and second optical paths. A polarizer is positioned in the first optical path between the laser diode and a first detector, which outputs a first detector signal corresponding to the measured optical power of polarized light. A second detector monitors light along the second optical path and provides a second detector signal. A bias compensation circuit receives the first and second detector signals and provides a bias current control signal, which is utilized to program a bias current source supplied to the laser diode. Additionally, multiple polarizer devices may be utilized e.g., a first polarizer in a first optical path aligned with the laser beam and a second polarizer in a second optical path aligned substantially orthogonal to the polarization of the laser beam.

24 Claims, 6 Drawing Sheets

AUTOMATIC SETTING OF LASER DIODE BIAS CURRENT

BACKGROUND OF THE INVENTION

The present invention relates to electrophotographic devices, and in particular, to systems and methods for setting laser diode bias current, In electrophotography, an imaging system forms a latent image by exposing select portions of an electrostatically charged photoconductive surface to laser light. For example, the imaging system may sweep a laser beam across the photoconductive surface in a scan direction as the photoconductive surface advances in a process direction that is substantially orthogonal to the scan direction. For each sweep of the beam, a corresponding laser is modulated to write a plurality of print elements (Pels). The density of the electrostatic charge on the photoconductive surface is altered in areas exposed to the laser beam relative to those areas unexposed to the laser beam, thus forcing a latent image on the photoconductive surface in a manner that corresponds with associated image data. The latent electrostatic image thus created is developed into a visible image by exposing the photoconductive surface to toner, which contains pigment components and thermoplastic components. When so exposed, the toner is attracted to the photoconductive surface in a manner that corresponds to the electrostatic density altered by the laser beam.

The toner pattern is subsequently transferred from the photoconductive surface to the surface of a print substrate, such as paper, which has been given an electrostatic charge opposite that of the toner. A fuser assembly then applies heat and pressure to the toned substrate before the substrate is discharged from the apparatus. The applied heat causes constituents including the thermoplastic components of the toner to flow into the interstices between the fibers of the medium and the applied pressure promotes settling of the toner constituents in these voids. The toner solidifies as it cools adhering the image to the substrate.

Electrophotographic imaging systems typically utilize a semiconductor laser diode as the source of the laser beam. Semiconductor laser diodes operate with a characteristic relationship between a forward current supplied through the diode and light output from the diode. In particular, the laser diode exhibits a low current region of operation where the laser diode behaves as a light emitting diode (LED), producing primarily spontaneous emission over a relatively broad wavelength band. However, as the forward current is increased, a threshold current level is reached where stimulated emission in the device begins to dominate and the laser diode starts to behave as a laser, producing narrow-band laser light. The threshold current level for a laser diode can vary significantly from device to device, even among similar devices. Moreover, the threshold current level can vary over the normal range of operating conditions for a given device.

Imaging system electronics provided to control the laser diode typically deliver a fixed bias current level to idle the laser diode below the threshold current levels and a second switched current that is selectively applied to the laser diode to modulate the laser beam on and off. However, in many applications for which off-state power is to be minimized, the fixed bias current level must be sufficiently low that it is guaranteed not to rise above the laser diode threshold under all operating conditions and for all laser diodes that are to be utilized in a corresponding application. Because typical laser diode designs exhibit a wide range of threshold current across production units, and since the threshold current level changes as a function of laser diode temperature and age, fixed bias current sources are typically set to a current level that is generally far below the threshold current level for most laser diodes operating under nominal conditions. Thus, the fixed bias current source may be a limiting factor to the speed and flexibility of a corresponding imaging system.

BRIEF SUMMARY OF THE INVENTION

Dynamic systems and methods of seeking and setting threshold bias current in a laser drive circuit are provided, which utilize a polarization ratio control system to establish laser diode operating current, e.g., at or near the threshold current for the device that is being driven.

A bias control for a laser driver circuit is also provided. The bias control includes at least one detector at least one polarizer and a bias compensation circuit. For example, in an exemplary arrangement, a laser diode emits light that travels at least along a first optical path and a second optical path. A polarizer is positioned in the first optical path between the laser diode and a first detector. The first detector outputs a first detector signal corresponding to the measured optical power of polarized light from the laser diode. A second detector monitors the optical power of light along the second optical path and provides a second detector signal. A bias compensation circuit receives the first detector signal and the second detector signal and provides a bias current control signal, which is utilized to program a programmable bias current source that supplies a bias current to the laser diode.

In another exemplary arrangement of the bias control, a laser diode emits light that travels at least along a first optical path and a second optical path. A first polarizer is positioned in the first optical path between the laser diode and a first detector. The first detector outputs a first detector signal corresponding to the measured optical power of polarized light from the laser diode. A second polarizer is positioned in the second optical path between the laser diode and a second detector. The second detector outputs a second detector signal corresponding to the measured optical power of polarized light from the laser diode. A select one of the first and second polarizer may be aligned with the laser beam and the remaining one of the first and second polarizer may be substantially orthogonal to the polarization of the laser beam. A bias compensation circuit receives the first detector signal and the second detector signal and provides a bias current control signal, which is utilized to program a programmable bias current source that supplies a bias current to the laser diode.

BRIEF DESCRIPTION OF THE SEVERAL VIEWS OF THE DRAWINGS

The following detailed description of various embodiments of the present invention can be best understood when read in conjunction with the following drawings, where like structure is indicated with like reference numerals, and in which.

DETAILED DESCRIPTION OF THE INVENTION

In the following detailed description of the illustrated embodiments, reference is made to the accompanying drawings that form a part hereof, and in which is shown by way of illustration, and not by way of limitation, specific embodiments in which the invention may be practiced. It is to be understood that other embodiments may be utilized and that changes may be made without departing from the spirit and scope of various embodiments of the present invention.

An Exemplary Electrophotographic Imaging Apparatus

Figure 1:
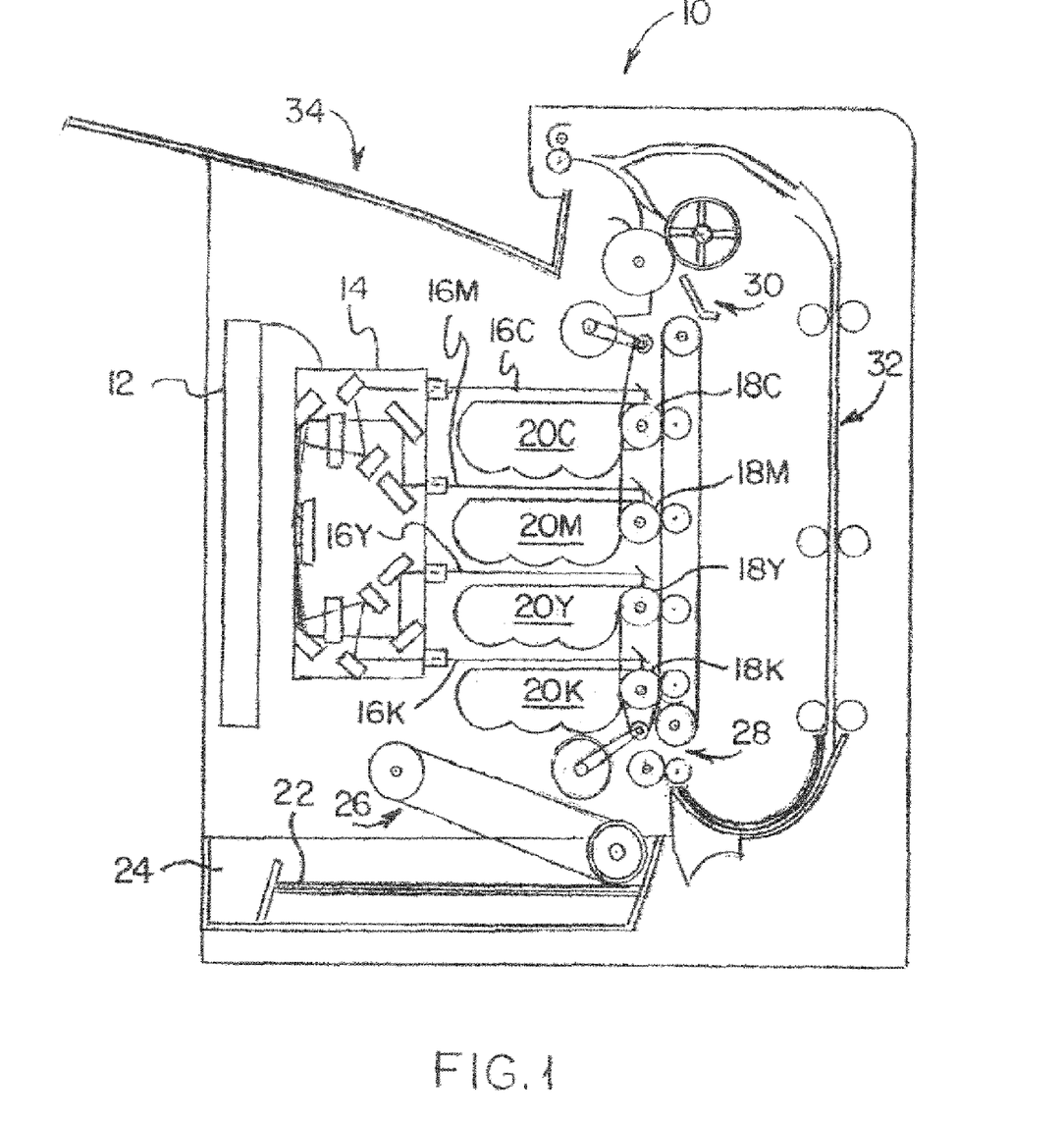
FIG. 1 is a schematic illustration of an exemplary electrophotographic apparatus.

Referring now to the drawings, and particularly to FIG. 1 an apparatus, which is indicated generally by the reference numeral 10, is illustrated for purposes of discussion herein as a color laser printer. An image to be printed is electronically transmitted to a main system controller 12 by an external device (not shown). The main system controller 12 includes system memory, one or more processors and other software and/or hardware logic necessary to control the functions of electrophotographic imaging.

For color operation, the image to be printed is de-constructed into four bitmap images, each corresponding to an associated one of the cyan, yellow, magenta and black (CYMK) image planes, e.g., by the main system controller 12 or by the external device. The main system controller 12 then initiates an imaging operation whereby a printhead 14 outputs first, second, third and fourth modulated laser beams 16K, 16Y, 16M and 16C respectively.

The first modulated laser beam 16K forms a latent image on a photoconductive drum 18K of a first image forming station 20K based upon the bitmap image data corresponding to the black image plane. The second modulated laser beam 16Y forms a latent image on a photoconductive drum 18Y of a second image forming station 20Y based upon the bitmap image data corresponding to the yellow image plane. The third modulated laser beam 16M forms a latent image on a photoconductive drum 18M of a third image forming station 20M based upon the bitmap image data corresponding to the magenta image plane. Similarly, the fourth modulated laser beam 16C forms a latent image on a photoconductive drum 18C of a fourth image forming station 20C based upon the bitmap image data corresponding to the cyan image plane. During the imaging operation, each modulated laser beam 16K, 16Y, 16M, 16C sweeps across its corresponding photoconductive drum 18K, 18Y, 18M and 18C in a scan direction that is perpendicular to the plane of FIG. 1.

The main system controller 12 also coordinates the timing of a printing operation to correspond with the imaging operation, whereby a top sheet 22 of a stack of media is picked up from a media tray 24 by a pick mechanism 26 and is delivered to a media transport belt 28. The media transport belt 28 carries the sheet 22 past each of the four image forming stations 20K, 20Y, 20M and 20C, which apply toner to the sheet 22 in patterns corresponding to the latent images written to their associated photoconductive drums 18K, 18Y, 18M and 18C. The media transport belt 28 then carries the sheet 22 with the toned mono or composite color image registered thereon to a fuser assembly 30. The fuser assembly 30 includes a nip that applies heat and pressure to adhere the toned image to the sheet 22. Upon exiting the fuser assembly 30, the sheet 22 is either fed into a duplexing path 32 for printing on a second surface thereof, or the sheet 22 is ejected from the apparatus 10 to an output tray 34.

An Exemplary Printhead

Figure 2:
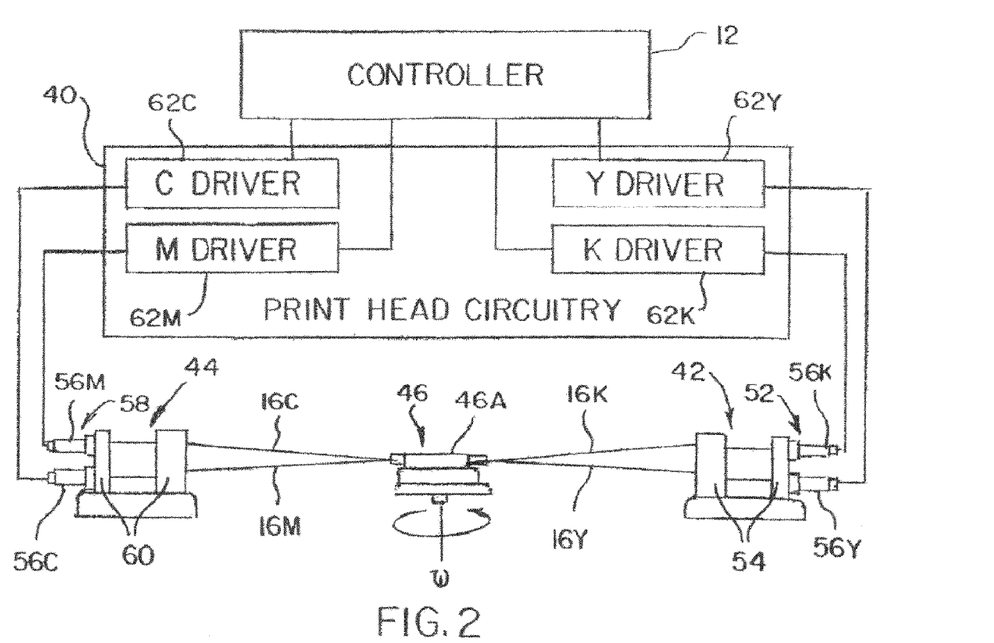
FIG. 2 is a schematic illustration of an exemplary printhead for the apparatus shown in FIG. 1.

Referring to FIG. 2, an exemplary printhead 14 includes generally, printhead circuitry 40 that is communicably coupled to the controller 12 for exchange of image data and control data between the printhead 14 and the controller 12, first and second pre-scan assemblies 42, 44 and a rotating polygon mirror 46 having a plurality of facets 46A. The first and second pre-scan assemblies 42, 44 include laser diodes 56K, 56Y, 56C, 56M and corresponding pre-scan optics systems 54, 60, such as lenses and/or reflective devices. Correspondingly, the printhead circuitry 40 comprises a first driver circuit 62K that is coupled to the first laser diode 56K, a second driver circuit 62Y that is coupled to the second laser diode 56Y, a third driver circuit 62M that is coupled to the third laser diode 56M, and a fourth laser driver 62C that is coupled to the fourth laser diode 56C.

The printhead circuitry 40 drives the laser diodes 56K, 56Y, 56C, 56M to emit corresponding laser beams 16K, 16Y, 16C, 16M that are swept by the polygon mirror 46 and pass through the appropriate post scan optics (not shown). The post scan optics direct the laser beams 16K, 16Y, 16C, 16M to their corresponding photoconductive drum 18K, 18Y, 18C, 18M (shown in FIG. 1) such that a scan line is formed each time a new facet intercepts a beam. The post scan optics may be provided as part of the printhead 4 or otherwise provided within the apparatus 10.

Although FIGS. 1-2 illustrate an exemplary multi-beam printhead and corresponding apparatus, other configurations may alternatively be implemented. For example, the photoconductive drums 18K, 18Y, 18M and 18C may be replaced with a photoconductive belt or other photoconductive surface(s). Moreover, the photoconductive surface(s) may transfer the toned image to an intermediate device such as an electrically conductive intermediate transport belt that subsequently carries the toned image to the sheet 22. As another example, a single photoconductive surface may be used to image each color plane in sequential processing steps. Also, while a single printhead 14 is illustrated, a separate printhead may alternatively be provided for each image forming station 20K, 20Y, 20M and 20C. Still further, the various aspects of the present invention discussed in greater detail herein may be applied to devices that include a single laser beam or multiple laser beams, and to monochrome as well as multi-color devices.

The Optical Scanner

The overall print quality of the apparatus 10 is sensitive to the optical output of the laser diodes 56K, 56Y, 56M, 56C. However, optical power requirements are known to vary widely, e.g., as much as 100% or more, from laser diode to laser diode. To account for such variations, each laser driver circuit 62K, 62Y, 62M, 62C of the printhead circuitry 40 comprise power management circuitry, which is described in detail below.

Laser Diode Operating Conditions

Figure 3:
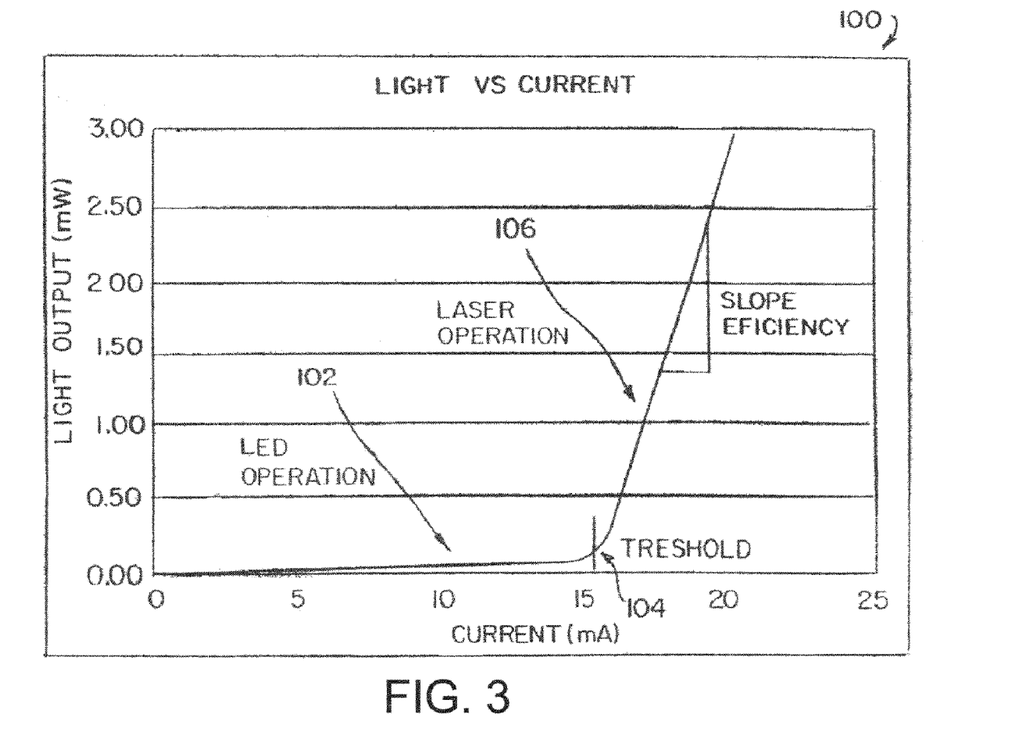
FIG. 3 is a plot illustrating a characteristic light-current (L-I) curve for a typical laser diode.

Semiconductor laser diodes operate with a characteristic relationship between a forward current supplied through the diode and light output from the diode. Referring to FIG. 3, a plot 100 illustrates laser diode output power vs. forward current for a conventional laser diode. As shown, the laser current is plotted along the axis of abscissa and optical power is plotted along the axis of ordinate. As the current increases from zero, the laser diode exhibits a low current region of operation 102 (also referred to herein as the LED operation region 102) where atoms in the laser diode's cavity may be excited so as to cause light to be emitted similar to that produced by a light emitting diode (LED). When operating the laser diode within the LED operation region 102, the laser diode produces primarily spontaneous emission over a relatively broad wavelength band with relatively low degree of polarization.

At some level of forward current, the efficiency with which the laser diode emits light increases dramatically and the slope of the curve increases but remains generally constant at this larger slope value. A minimum current of increased current efficiency, i.e., the current at which the slope discontinuity occurs, is referred to herein as the threshold current 104 and is designated herein as Ith.

As the forward current is increased beyond the threshold current 104, stimulated emission in the laser diode begins to dominate, and the laser diode enters a laser operation region 106, whereby the laser diode starts to behave as a laser, producing narrow-band, highly polarized light. For forward current levels that exceed the threshold current 104, the change in light output is directly proportional to the change in forward current through the laser diode. This constant of proportionality (ratio of light output to current) is referred to herein as the "slope efficiency" or "differential efficiency" and is designated ($\eta$).

The threshold current 104, differential efficiency ($\eta$) and power at the threshold generally change as a function of temperature and the age of the laser diode device. Moreover, the above parameters can vary from laser diode to laser diode.

Referring back to FIGS. 1 and 2, the light from each of the laser beams 16K, 16Y, 16C, 16M is modulated to produce a desired exposure pattern as the laser beams are scanned across their corresponding photoconductive drum 18K, 18Y, 18C, 18M. Each corresponding laser diode 56K, 56Y, 56C, 56M is thus typically driven, e.g., by the corresponding laser drivers 62K, 62Y, 62C, 62M such that when the laser beams 16K, 16Y, 16C, 16M fall in an area that is to remain unexposed, the current through the corresponding laser diode 56K, 56Y, 56C, 56M is set well below the threshold current to minimize the amount of light emitted. This state of operation is referred to herein as the "off" state. When the laser beams 16K, 16Y, 16C, 16M fall in an area that is to be fully exposed, the current through the corresponding laser diode 56K, 56Y, 56C, 56M is set to a level well above the threshold region that produces a predetermined amount of optical power. This state of operation is referred to herein as the "on" state. The amount of current flowing through each laser diode 56K, 56Y, 56C, 56M in the off state is referred to herein as the "bias current" and the corresponding amount of current flowing through each laser diode 56K, 56Y, 56C, 56M in the on state is referred to herein as the "operating current".

For a given laser diode design, there will be an inherent variation among laser diode devices in threshold current and slope efficiency. Furthermore, these parameters change with operating conditions, including changes in temperature and device age. Thus, for example, the operating current and/or the bias current applied to each of the laser diodes 56K, 56Y, 56C, 56M described with reference to FIG. 2 may be the same or different for the same desired optical output power level for each of the laser beams 16K, 16Y, 16C, 16M when modulated to an on state.

Referring back to FIG. 3 when a step-function change in forward current is applied to a laser diode, there is an inherent delay before light is output from the laser diode device. This delay may be due, for example, to a parasitic inductance and capacitance associated with the laser diode or to the intrinsic physical dynamics of the laser mechanism. For an initial bias current set to zero, the amount of delay is maximized. As the bias current level increases toward the threshold 104 within the LED operation region 102 of the corresponding light output vs. current curve, the delay time decreases. If the bias current level is at or above threshold current 104, the laser diode turn-on delay is minimized. Keeping the bias current at or near the threshold current 104 thus optimizes device response while minimizing the amount of light emitted in the off state. Thus, it may be advantageous to setting the off-state laser operating current at or near the laser diode device threshold current 104.

According to one aspect of the present invention, systems and methods are provided for controlling the bias current such that the bias current remains at or near the device threshold current 104.

Figure 4:
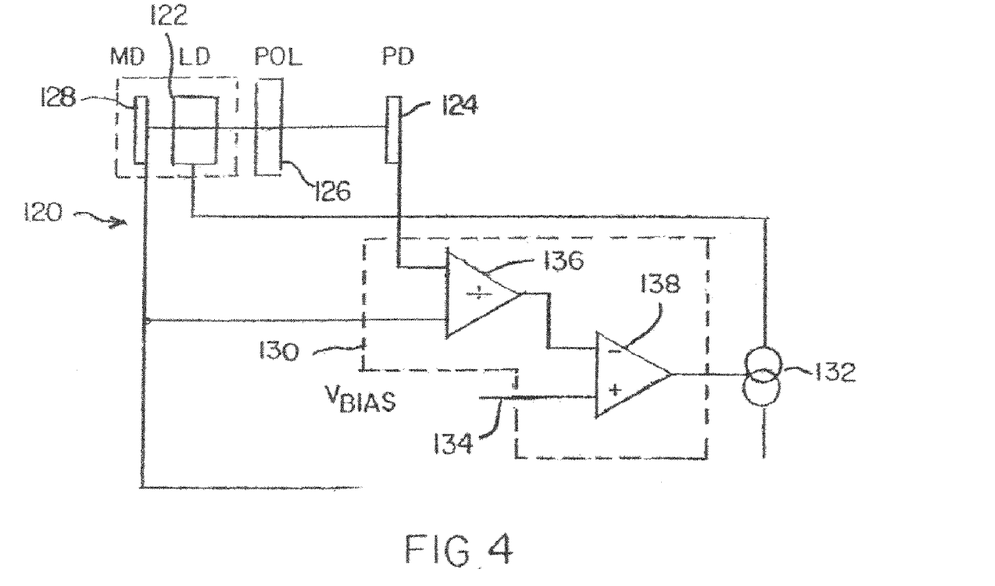
FIG. 4 is a schematic illustration of a laser diode bias control system according to an aspect of the present invention.

Referring to FIG. 4, a laser bias control system 120 comprises a laser diode 122, a first detector 124, a polarizer 126, a second detector 128, a bias compensation circuit 130 and a bias current source 132. The laser bias control system 120 may be implemented, for example, as part of each of the laser drivers 62K, 62Y, 62C, 62M described with reference to FIG. 2, or as part of other laser driver configurations. Similarly, the laser diode 122 may comprise one of the laser diodes 56K, 56Y, 56C, 56M, or comprise a laser diode in an alternative printhead configuration.

The bias current source 132 is coupled to the laser diode 122 so as to provide a forward current through the laser diode 122. The bias compensation circuit 130 may control the amount of current output by the bias current source 132 such that the forward current provided to the laser diode 122 from the bias current source 132 substantially approaches (and tracks) the operating threshold current 104.

The laser diode 122 emits light that travels along two optical paths, including a first optical path and a second optical path. The first optical path may be directed, for example, to the corresponding photoconductive surface for imaging operations. Light emitted by the laser diode 122 along the first optical path passes through the polarizer 126 and impinges upon the first detector 124. The first detector 124 may comprise any device that can monitor the light output through the polarizer 126, and may comprise, for example, a photodiode, PIN diode, photodetector or other suitable device for measuring, detecting or otherwise recognizing light along the first optical path. The first detector 124 thus monitors the optical power of light along the first optical path. Moreover, the first detector 124 provides a first detector signal that is coupled to the bias compensation circuit 130.

The axis of the polarizer 126 may be aligned to the laser diode 122 such that a maximum amount of power emitted from the laser diode 122 is transmitted through the polarizer 126 when the laser diode 122 is operating in the on state, i.e., emitting a laser beam. As will be described in greater detail herein, when the axis of the polarizer 126 is aligned to the laser diode 122, the incident optical power of the polarized light measured by the first detector 124 may be substantially the same as the incident optical power of the light in the first optical path before the polarizer. However, when the laser diode 122 is in the off state, i.e., when the light generated by the laser diode comprises substantially spontaneous emission, the incident optical power of the polarized light measured by the first detector 124 will be generally less than the incident optical power of the light in the first optical path before the polarizer 126.

Further, light emitted by the laser diode 122 along the second optical path impinges upon the second detector 128. The second detector 128 thus monitors the optical power of light along the second optical path and may comprise, for example, a photodiode, PIN diode, photodetector or other suitable device for measuring, detecting or otherwise recognizing light. Moreover, the second detector 128 provides a second detector signal that is coupled to the bias compensation circuit 130.

The second detector 128 may comprise a back-biased PIN diode. By sensing the current through the PIN diode, an approximation of the output power of the laser diode 122 can be determined. In practice, a conventional laser diode device may comprise the laser diode 122 with a facet at the back of its laser junction and a small PIN diode, referred to herein as a detector photodiode, which senses light output from the back facet. The power measured by the detector photodiode is assumed to be proportional to the light output from the front of the laser diode 122. As such, the second detector 28 may be implemented by the detector photodiode, and thus be packaged internal to the laser diode device, as schematically represented by the dashed line around the laser diode 122 and the second detector 128.

Bias Control

According to one aspect of the present invention, current-dependent laser diode output polarization changes are utilized to determine compensation to the bias current source 132 so that the bias current source 132 substantially tracks the threshold current of the corresponding laser diode 122.

As illustrated, the bias compensation circuit 130 comprises a divider 136 and a differential control circuit 138. The output of the first detector 124 and the output of the second detector 128 are coupled to respective inputs of the divider 136. The divider 136 generates a ratiometric signal corresponding to the first detector signal relative to the second detector signal. The ratiometric signal is coupled to an "−" input of the differential control circuit 138. A control signal 134, (designated herein as Vbias) is coupled to the "+" input of the differential control circuit 138. The output of the differential control circuit 138 provides a bias current control signal and is coupled to the programmable bias current source 132 so as to control the bias current level, and thus vary the forward current through the laser diode 122.

For example, the differential control circuit 138 may comprise an operational amplifier (op-amp), comparator or other suitable device capable of performing a comparison of two or more signals. Under this arrangement, the comparator adjusts the current level applied to the programmable bias current source 132, thus affecting the bias current applied to the laser diode 122, until the ratiometric signal of the divider 136 is substantially equal to the control signal 134 (Vbias).

When the forward current applied to the laser diode 122 is below the threshold current optical output from the laser diode 122 is dominated by spontaneous emission, which is characterized by a generally low degree of polarization. When this nearly randomly polarized light passes through the polarizer 126, it is attenuated, e.g., by approximately 50%. However, when the forward current applied to the laser diode 122 is above the threshold current optical output from the laser diode 122 is dominated by stimulated emission, which is characterized by a very high degree of polarization. Given that the polarizer axis of the polarizer 126 is aligned with the polarization axis of the laser diode 122, nearly all of this strongly polarized light will be transmitted through the polarizer 126.

If the absorptive and surface reflection losses in the polarizer 126 are neglected the ratio of the output power measured with the polarizer 126 in place (designated herein as P[p]) to the power measured without the polarizer 126 (designated herein as P[np]) will shift from a value of 0.5 (or some other determined attenuation) for laser operating current below threshold to approximately 1.0 as the current increases through and above the threshold current.

Figure 5:
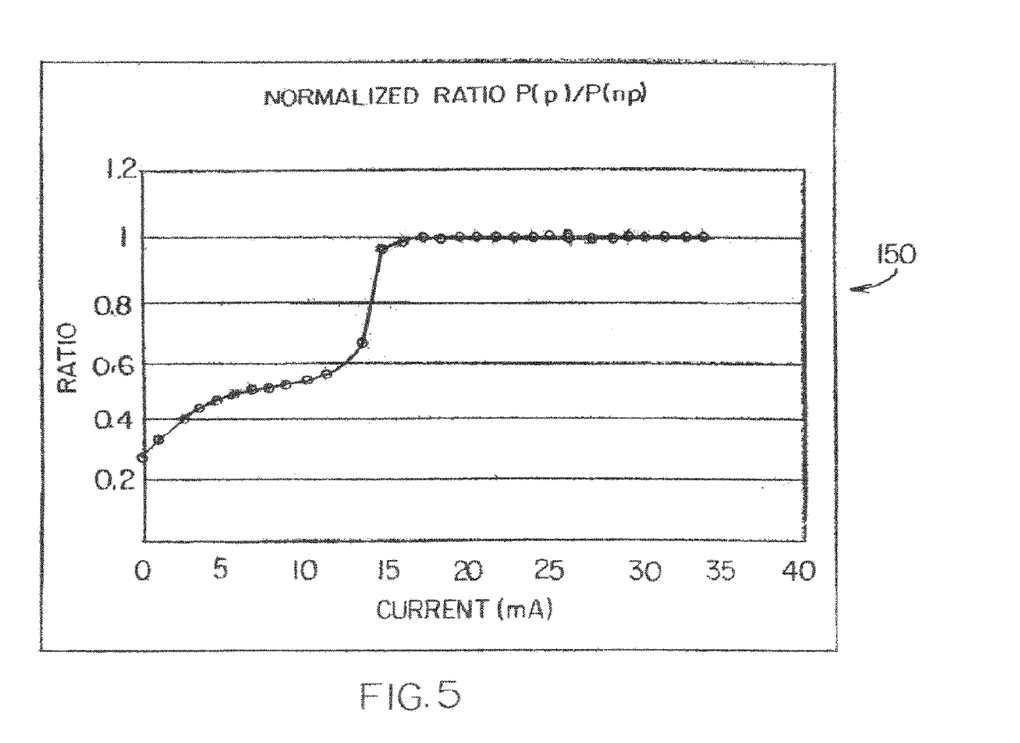
FIG. 5 is a plot illustrating a normalized ratio of polarization filtered light output to non-filtered light for an exemplary laser diode.
Figure 6:
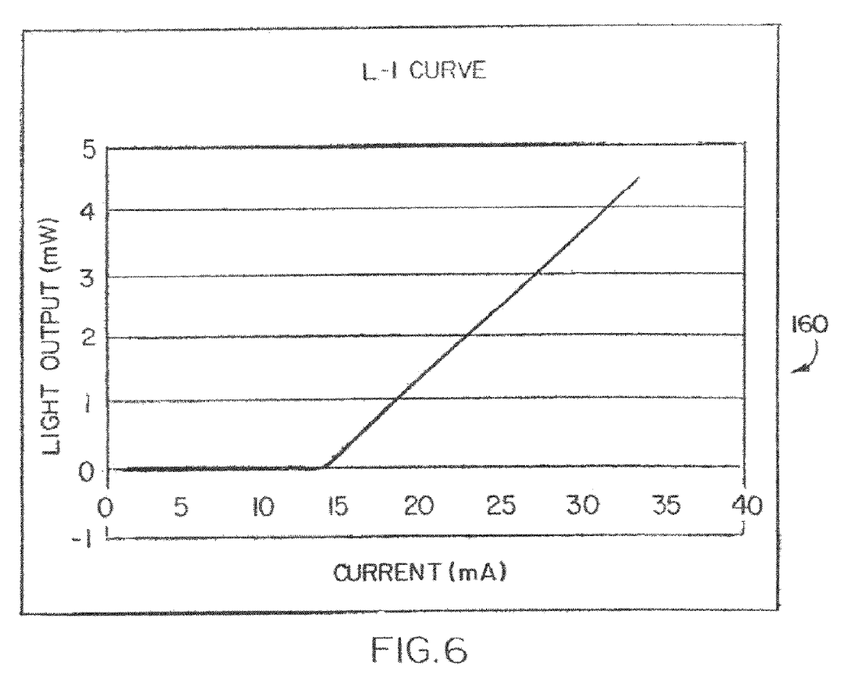
FIG. 6 is a plot illustrating a characteristic light-current (L-I) curve for the exemplary laser diode used to derive the data in the plot of FIG. 5.

Referring to FIG. 5, a plot 150 illustrates the ratio of laser diode output power measured after the light has passed through the polarizer 126 to laser diode output power measured without passing the light through the polarizer 126 as a function of current through the laser diode. As shown, the plot of P[p]/P[np] has been normalized to a value of 1.0 for normal on-state current for convenience of discussion herein. Referring to FIG. 6, the corresponding laser characteristic curve 160 for the exemplary laser diode is shown. As FIG. 6 illustrates for the exemplary laser diode, and under the particular exemplary conditions, the threshold current is at about 14 milliamps. Referring back to FIG. 5, a sharp change in the slope of the plot of P[p]/P[np] is also seen substantially at the threshold current (about 14 milliamps), Referring back to FIG. 4, assuming that the response of the second detector 128 exhibits no polarization dependence, the output (P[sd]) of the second detector 128 can be utilized to determine the diode power that would be emitted without the polarizer in the beam path. That is P[np] is substantially equal to P[sd]. Thus the ratio P[p]/P[sd] should produce a similar function of current as P[p]/P[np] described above with reference to FIG. 5.

Figure 7:
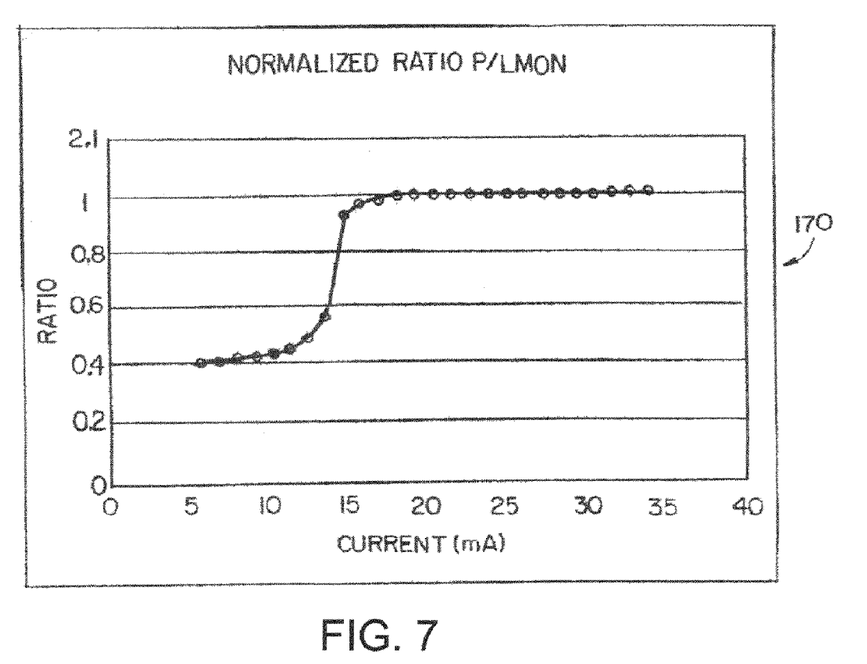
FIG. 7 is a plot illustrating a normalized ratio of polarization filtered light output to laser monitor current.

Assume that the second detector 128 is implemented as a PIN diode packaged with the laser diode 122 as described above, and that the output current of the PIN diode is denoted I[mon]. Thus, the current I[mon] corresponds with the second detector power P[sd]. Referring to FIG. 7 a plot 170 illustrates laser diode output power measured after the light has passed through the polarizer 126 as a function of laser diode output power measured from the PIN diode feedback I[mon], normalized to a value of 1.0 for normal on-state current. Comparing the plots of FIGS. 5 and 7, it can be seen that for the region around the threshold current, the ratio P[p]/P[np] is substantially equal to P[p]/I[mon].

By setting the control signal 134 (Vbias) to approximately Vbias=0.7P[p]/[Imon], the bias compensation circuit 130 will increase the bias current level provided by the programmable bias current source 132 until the laser diode 122 is operating substantially at its operating threshold current. Further, since the transition between randomly polarized output and highly polarized output is not abrupt, the bias compensation circuit 130 may program the programmable bias current source 132 to provide a forward current to the laser diode 122 which is slightly above or below its operating threshold current by varying the control signal 134 up or down, respectively.

Signals within the laser bias control system 120 may be scaled, filtered, buffered, offset, calibrated, converted, etc., to accommodate the properties and performance of actual devices used to implement functions of the bias control system 120 without significantly deviating from the disclosed manner of operation. For example, the output of the first detector 124 and/or second detector 128 may be buffered, converted from a current to a voltage, scaled, etc. Also, the bias compensation circuit 130 may be realized in hardware, e.g., using suitable logarithmic amplifiers, anti-logarithmic amplifiers, operational amplifier and other circuits to perform the division and comparison functions. Still further, the output of the first detector 124 and the second detector 128 may be converted to digital signals and the ratiometric and differential control of the bias compensation circuit 130 may be performed digitally, e.g., by a suitable processing device such as the processor 12, a digital processing device, an application specific integrated circuit chip (ASIC), a microcontroller or other suitable device, e.g., provided as part of the laser driver circuits 62K, 62Y, 62M, 62C, etc.

In the configuration described with reference to FIG. 4, the light output from the laser diode 122 near threshold is reduced by the interposed polarizer 126 in the first optical path, e.g., up to approximately 50%. Thus, for applications requiring that the light emitted by the laser in the off state be minimized, threshold biasing can be realized without incurring the full penalty of increased off-state power. Regardless of method used to set bias current, the interposed polarizer 126 may be employed to reduce the off-state power delivered to the remainder of the application system without significantly reducing the on-state power so delivered.

There are a number of possible variations on the use of current-dependent laser diode output polarization changes to determine bias current source compensation, e.g., so that the bias current source 132 tracks the threshold current of the corresponding laser diode 122. As an additional example, it is possible to achieve control of the bias current supplied by the bias current source 132 to substantially follow the threshold current of the corresponding laser diode 122 by aligning the polarizer 126 such that it minimizes the power measured by the first photodetector 124 when the laser diode 122 is operating in the on state, i.e., emitting a beam. For this configuration, the ratiometric signal of the divider 136 drops from a first value, e.g., approximately 0.5 when the programmable current source 132 provides a current below the operating threshold current (and the laser diode 122 is not driven to emit a laser beam), to a second value, e.g., nearly 0.0 when the programmable current source 132 provides a current above the operating threshold current so that the laser diode 122 emits a laser beam. Depending upon the configuration of the bias compensation circuit 130, when the polarizer 126 minimizes the power measured by the first photodetector 124 when the laser diode 122 is operating in the on state, it may also be necessary to swap the '+' and '−' inputs of the differential control circuit 138.

It may also be possible to optimize the design of a laser diode 122 such that optical emission below its operating threshold current is preferentially polarized substantially orthogonal to the direction of polarization for emission above threshold. Thus, the ratiometric signal of the divider 136 could be made to fall well below 0.5 below threshold.

Figure 8:
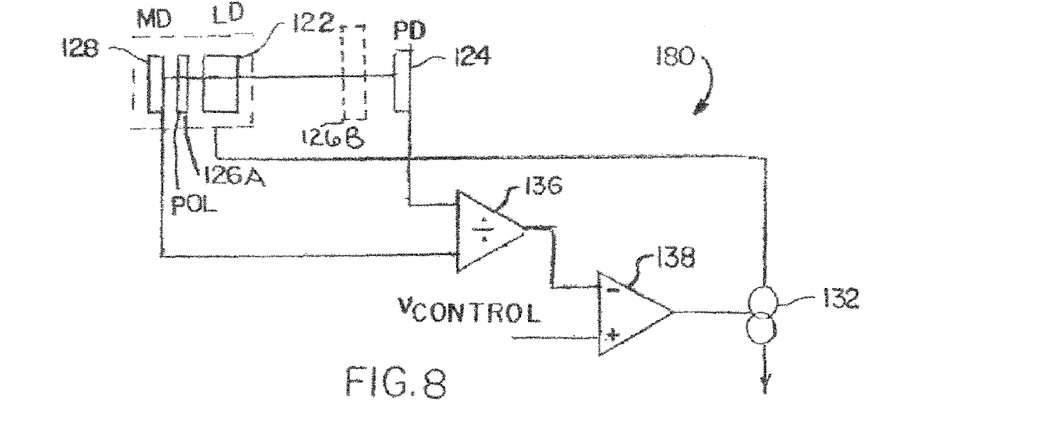
FIG. 8 is a schematic illustration of a laser diode bias control system according to another aspect of the present invention.

Referring to FIG. 8, a bias control system 180 is substantially the same as the bias control system shown in FIG. 4. However, in the bias control system 180, the first optical path is directed out the back facet of the laser diode 122 and the second optical path is directed, for example, towards a corresponding photoconductive surface for an imaging operation. In the exemplary configuration illustrated in FIG. 8, the first and second optical paths have been reversed relative to the exemplary configuration illustrated in FIG. 4. As such, for purposes of clarity of discussion with regard to the optical paths in FIG. 8, the detector 128 is hereinafter referred to as the first detector as it is positioned in the first optical path and the detector 124 is hereinafter referred to as the second detector as it is positioned in the second optical path. According to one aspect of the present invention, a first polarizer 126A is incorporated into the laser diode housing in an optical path between the back facet of the laser diode 122 and the first detector 128. The first detector 128 may also be manufactured internal to the housing of the laser diode 122, e.g., as an integral PIN diode. The positioning of the first polarizer 126A between the laser diode 122 and the first detector 128 in this manner would not affect normal operation of the laser diode 122 writing image data to the corresponding photoconductive surface. Moreover, this aspect of the present invention allows a bias control circuit to be implemented without requiring an external polarizer.

However, under this arrangement, the light that produces the PIN diode feedback signal I[mon] will have been processed by the first polarizer 126A and the light impinging upon the second detector 124 will not have passed through the polarizer. As such, the inputs into the divider 136 are opposite of that illustrated with respect to FIG. 4. Accordingly, suitable adjustments may be required to ensure proper operation of the bias control system. For example, the bias control system 180 may utilize the ratio I[mon]/P[np] to control bias current, where P[np] is the power measured by the second detector 124 with no polarization. In this regard, the external second detector 124 could be provided at any suitable location in the device 10, e.g., somewhere in the laser beam scan path that is located outside the printable area of the corresponding photoconductive surface of the drum.

As an alternative, an optional second polarizer 126B may be positioned in the second optical path in addition to the first polarizer 126A in the first optical path. For example, the first polarizer 126A may be aligned substantially orthogonal to the polarization of a corresponding laser beam and the second polarizer 126B may be aligned with the polarization of the corresponding laser beam. The use of first and second polarizers 126A, enhances the contrast between the optical power in the first and second optical paths because the detector signal for the polarized beam that is substantially orthogonal to the corresponding laser beam, e.g., the first detector that detects the light that passes through the first polarizer 126A in the above example, will approach zero as laser operation passes the laser threshold Ith and above. Correspondingly, the polarizer that is aligned with the corresponding laser beam, the second polarizer 126B in the above example, will be substantially fully transmissive for laser power above the laser threshold Ith.

Figure 9:
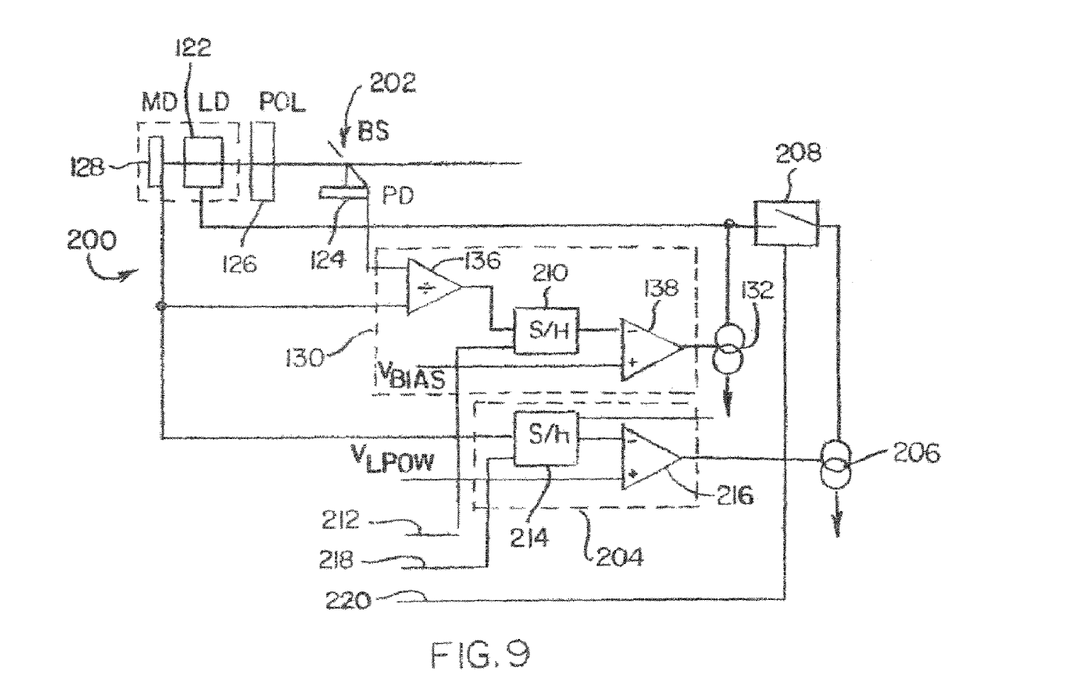
FIG. 9 is a schematic illustration of a laser diode control system using a sample and hold function to set bias and operating currents.
Figure 11:
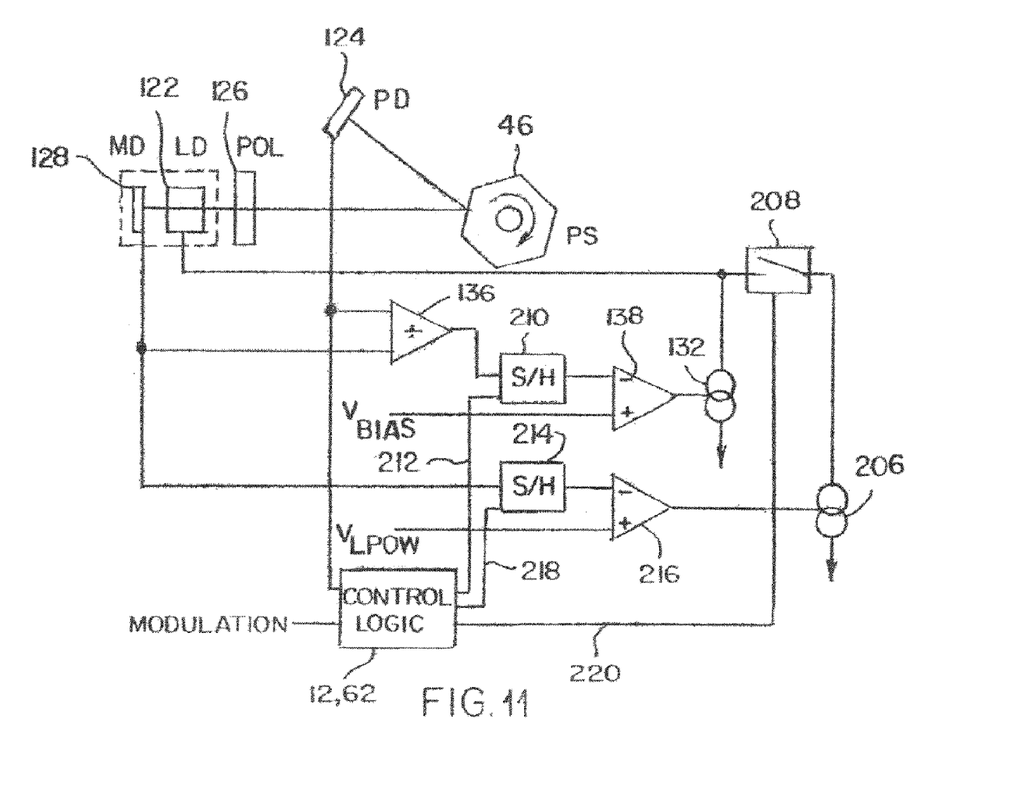
FIG. 11 is a schematic illustration of an alternative laser diode control system.

In this regard, the use of multiple polarizers can be applied to other optical path configurations, including for example, those configurations described and set out more fully herein with reference to FIGS. 4, 9, and 11.

According to yet a further aspect of the present invention, a laser diode could incorporate two detector photodiodes, e.g., both the first and second detectors 124, 128, within the device package, each of which is situated to receive approximately half the light emitted from the back facet of the laser diode and provide a unique diode feedback signal external to the laser diode package. Under this configuration, the polarizer 126 is also internally packaged, and is interposed between the laser diode and only one of the detector photodiodes, e.g., the first detector 124. The bias control circuit would use the ratio I[mon_p]/I[mon_np] as a control parameter, where I[mon_p] is a current generated by the first detector 124 masked by the polarizer 126, and I[mon_np] is the current generated by the second detector 128. Under this arrangement, the signals I[mon_p] and I[mon_np] are coupled to the divider 136 and the rest of the circuit operation is analogous to that described above with reference to FIG. 4. As yet another alternative a polarizer may be positioned between each detector packaged with the laser diode respectively. For example, a first polarizer 126A may be positioned between the back facet of the laser diode 122 and a first detector 124 and may be aligned substantially orthogonal to the polarization of a corresponding laser beam. A second polarizer 126B may be positioned between the back facet of the laser diode 122 and a second detector 128 and may be aligned with the polarization of the corresponding laser beam. Thus, the laser diode 122, the first and second polarizers 126A, 126B and the first and second detectors 124, 128 may be packaged in the same device package.

Referring to FIG. 9, a laser driver control system 200 is illustrated. The laser driver control system 200 may be implemented, for example, as part of one of the laser drivers 62K, 62Y, 63C, 62M described with reference to FIG. 2 and may also comprise the bias control system described herein with reference to FIGS. 3-8. The laser driver control system 200 comprises the laser diode 122, the first detector 124, the polarizer 126, a beam splitter 202, the second detector 128, the bias compensation circuit 130, the bias current source 132, a modulation compensation circuit 204, a modulation current source 206 and a modulation switch 208.

In a manner analogous to that described above with reference to FIG. 4, light output from the laser diode 122 impinges upon the second detector 128. For example, the second detector 128 may comprise a PIN diode packaged with the laser diode 122 so as to measure light emitted from a back facet of the laser diode 122. Light emitted by the laser diode 122 also passes out a front facet and passes through the polarizer 126. The light beam is then split by the beam splitter 202 such that a first light beam continues on, e.g., to the polygon mirror and post scan optical systems as described in greater detail herein with reference to FIGS. 1 and 2. A second light beam from the beam splitter 202 is coupled to the first detector 124.

The compensation circuit 130 is substantially as described with reference to FIG. 4, but now further illustrates the use of a sample and hold circuit 210 between the divider 136 and the differential control circuit 138. The ratiometric signal of the divider 136 is coupled to the input of the sample and hold circuit 210. The sample and hold circuit 210 is further coupled to a bias sample enable signal 212. This allows, for example, the controller 12 (or other suitable control device) to determine when the bias current source 132 is updated. For example, a specific application may only adjust the current level of the bias current source 132 when the laser beam from the laser diode 122 has moved past an imaging area of its corresponding photoconductive drum. Thus, when the bias sample and hold enable signal 212 is in an active state, the (potentially changing) value of the ratiometric signal from the divider 136 is sampled. When the bias sample and hold enable signal 212 is in an inactive state, the last sampled ratiometric signal from divider 136 is held.

The second detector signal from the second detector 128 is also coupled to the laser drive compensation circuit 204. The laser drive compensation circuit 204 comprises a drive sample and hold circuit 214 and a drive comparator 216. The drive comparator 216 sets the current level to the laser operating current source 206. Essentially, the laser drive compensation circuit 204 compares the measure of laser light output by the second detector 128 (as sampled by the drive sample and hold circuit 214, with a laser power control signal 214. The laser power control signal 214 corresponds to a measure of the desired laser power when the laser diode 122 is operated in the on state. When a drive sample and hold enable signal 218 is active, the laser diode feedback derived from the second detector 128 is compared with the laser power control signal 214 and the operating current of the laser operating current source 206 is adjusted until the laser output power as measured by the second detector 228 substantially corresponds to the laser power control signal 214.

The laser operating current source 206 is coupled to the laser diode 122 via the switch 208, and the switch 208 is controlled by the laser modulation signal 220. When the laser diode 122 is to emit a laser beam in the on-state, the laser modulation signal 220 is adjusted so that the switch 208 closes. When the switch 208 is closed, the total current flowing through the laser diode 122 is I bias+I drive (the sum of the currents from the bias current source 132 and the operating current source 206). When the laser diode 122 is to be modulated off, the laser modulation signal 220 controls the switch 208 to open so that the total current flowing through the laser diode 122 is the bias current from the bias current source 132.

The bias current established by the bias current source 132 may be set, for example, to track the operating threshold current of the laser diode 122 as described more fully herein.

Figure 10:
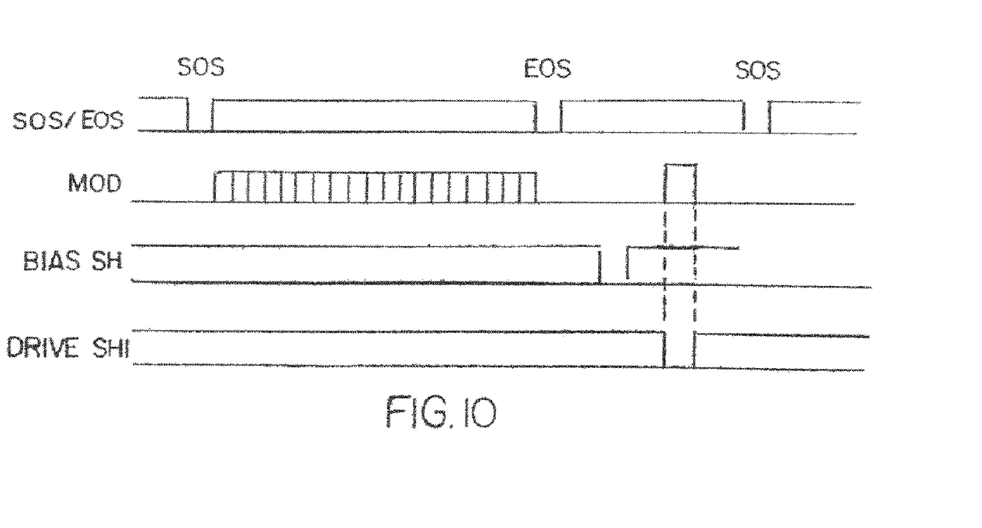
FIG. 10 is a timing diagram for operation of the laser drive system of FIG. 9.

Referring to FIG. 10, a timing diagram illustrates one exemplary approach to controlling the laser driver system 200 shown in FIG. 9. A start of scan signal (SOS) indicates that the laser diode 122 is about to sweep past an imaging area of the corresponding photoconductive surface, e.g., one of the photoconductive drums 18K, 18Y, 18C, 18M described with reference to FIG. 1. After the SOS signal, the laser modulation signal 220 is modulated on and off (to correspondingly close and open the switch 208 to couple the operating current source 206 to the laser diode 122). The end of the print region is designated by the end of scan signal (EOS). During the print region of the scan, designated as the area between the SOS and EOS signals, the Bias S_H (bias sample and hold signal 212) and the Drive S_H (drive sample and hold signal 218) are held inactive.

After the EOS signal, the laser beam is not within a print region of the corresponding photoconductive drum and the device runs a calibration operation. As shown, the first operation is to enable the Bias S_H (bias sample and hold signal 212). This allows the bias control circuit to calibrate the bias current source 132, e.g., to track the threshold current as described more fully herein. During the bias calibration, designated by the active low state of the Bias S_H (bias sample and hold signal 212), the operating current source 206 is not coupled to the laser diode 122 as noted by the modulation signal 220 being off (low).

Once the bias current is set, the Bias S_H (bias sample and hold signal 212) is disabled, as designated by the transition of the Bias S_H signal from an active low state to an inactive high state. Now that the bias current is substantially equal to its programmed value, e.g., the threshold current, the operating current of the operating current source 206 is calibrated. The drive Drive S_H (drive sample and hold signal 218) is transitioned from its inactive high state to an active low state. Additionally, the modulation signal 220 is turned on, thus closing the switch 208 allowing the operating current of the operating current source 206 to drive the laser diode 122 to its on state and emit a laser beam. The operating current source 206 is then calibrated, e.g., as described more fully herein. Once the operating current calibration operation is complete, the drive Drive S_H (drive sample and hold signal 218) is transitioned from its active low state to an inactive high state. Additionally, the modulation signal 220 is turned off, opening the switch 208 from the operating current source 206 to the laser diode 122.

Referring to FIG. 11, a system 250 is illustrated which is similar to the system of FIG. 10. However, the beam splitter 204 shown in FIG. 10 is not utilized in the system 250. Rather the first optical path passes through the polarizer 126 and is reflected off the polygon mirror 46, thus directing the first optical path towards the first detector 124. Thus, the first detector 124 can pick off the light along the first optical path at some position along its scan path, e.g., outside the printable region as illustrated in the timing diagram to FIG. 10. That is, as the polygon mirror 46 rotates, the light along the first optical path periodically scans across the first detector 124.

When a signal is detected on by the first detector 124, control logic 12, 62, etc. performs the calibration operation as described more fully with regard to the timing diagram of FIG. 10. That is, the control logic switches the operating current source 206 out of the laser diode path, e.g., by turning off the modulation signal 220, leaving only the bias current source 132 providing a forward current to the laser diode 122. The bias sample/hold circuit 210 is then triggered, e.g., by asserting the bias sample and hold signal 212 to an active state, to capture the ratiometric signal from the divider 136 so that the bias current can be set by the differential control circuit 138. Next, the operating current source 206 is switched to couple to the laser diode 122, e.g., by asserting the modulation signal 220 and the operating current sample and hold circuit 214 is activated, e.g., by asserting the drive sample and hold signal 218 to capture the second detector signal so that the operating current can be set.

As will be appreciated by one of skill in the art, the various aspects of the present invention simplify multi-level drive schemes by choosing a bias current, such as at or near the threshold current. For example, a system might employ multiple operating current sources, which could be selectively applied to the laser diode. With the application of a bias current equal to the device threshold current, the power output from the device is a linear superposition of the powers generated by each operating current source independently. Accordingly, there may be some degree of flexibility in setting the off-state laser operating current at or near the device threshold. Moreover, the application of a bias current at or near the device threshold results in a minimum turn-on delay when current through the device is modulated between its off-state level and its on-state level, implying maximum frequency response of the device for the given modulation conditions.

The various aspects of the present invention may be embodied as a method, system, or computer program product. Moreover, the various aspects of the present invention may take the form of an entirely hardware embodiment or an embodiment combining software and hardware aspects.

It should also be noted that, in some alternative implementations, the functions noted in the schematic and block diagrams may occur out of the order noted in the figures, for example, two blocks shown in succession may, in fact, be executed substantially concurrently, or the blocks may sometimes be executed in the reverse order, depending upon the functionality involved.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. For example, the various aspects of the present invention may be implemented in a copier, facsimile machine, multi-function machine, or other suitable structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having thus described the invention of the present application in detail and by reference to preferred embodiments thereof, it will be apparent that modifications and variations are possible without departing from the scope of the invention defined in the appended claims.

What is claimed is:

1. A bias control for a laser driver circuit comprising:
   a laser diode that is controlled to emit modulated light that travels along a first optical path and a second optical path, wherein said laser diode is driven by a bias current when said laser diode is modulated off and an on state operating current when said laser diode is modulated on so as to emit laser light;
   a first detector that detects the optical power of light along said first optical path and provides a first detector signal;
   a first polarizer in said first optical path between said laser diode and said first detector;
   a second detector that detects the optical power of light along said second optical path and provides a second detector signal;
   a bias compensation circuit that receives said first detector signal and said second detector signal and provides a bias current control signal, wherein said first detector signal corresponds to the optical power of polarized light along said first optical path, said second detector signal corresponds to the optical power of said light along said second optical path and said bias current control signal is determined based upon a ratio of said first detector signal relative to said second detector signal and a comparison of the ratio with respect to a predetermined bias signal; and
   a programmable bias current source that supplies said bias current to said laser diode, said programmable bias current source programmed by said bias current control signal of said bias compensation circuit so as to adjust said bias current to a predetermined value.

2. The bias control according to claim 1, wherein:
   said second optical path is through a back facet of said laser diode; and
   said second detector is integrally packaged with said laser diode.

3. The bias control according to claim 1, wherein:
   said first optical path is directed through a back facet of said laser diode; and
   said first polarizer and said first detector are integrally packaged with said laser diode.

4. The bias control according to claim 1, wherein said bias current control signal programs said bias current source such that said bias current supplied to said laser diode corresponds substantially with an operating threshold current of said laser diode.

5. The bias control according to claim 1, wherein said first polarizer reduces light output of said laser diode when said bias current is lower than said operating threshold current.

6. The bias control according to claim 1, further comprising a second polarizer in said second optical path between said laser diode and said second detector, said first polarizer aligned with a beam of said laser diode and said second polarizer aligned substantially orthogonal to said beam of said laser diode.

7. The bias control according to claim 1, wherein said bias compensation circuit comprises:
   a divider that determines said ratio of said first detector signal relative to said second detector signal and provide a ratiometric signal; and
   a comparator that compares said ratiometric signal of said divider with said control signal and outputs said bias current control signal.

8. The bias control according to claim 7, wherein said bias compensation circuit further comprises a sample and hold circuit that samples said ratiometric signal during a calibration operation and holds said ratiometric signal during an imaging operation.

9. The bias control according to claim 7, wherein said control signal is set to a value corresponding to approximately 0.7 times an output power of said light measured after said light has passed through said first polarizer divided by a measured current corresponding to said output of said light not passing through said first polarizer when said laser diode is operated substantially at its corresponding threshold current.

10. The bias control according to claim 1, wherein an axis of said first polarizer is aligned with said laser diode such that a maximum amount of power emitted from said laser diode is transmitted through said first polarizer when said laser diode is modulated on such that said laser diode emits laser light.

11. The bias control according to claim 1, wherein said first polarizer minimizes a power on said first detector when said laser diode is driven to emit a laser beam.

12. The bias control according to claim 1, further comprising a beam splitter in said first optical path between said first polarizer and said first detector so as to split polarized light along said first optical path into a third optical path that is directed to a photoconductive surface.

13. A method of biasing a laser driver circuit comprising:
   providing a laser diode that is controlled to emit modulated light that travels along a first optical path and a second optical path, wherein said laser diode is driven by a bias current when said laser diode is modulated off and an on state operating current when said laser diode is modulated on so as to emit laser light;
   providing a first detector that detects the optical power of light along said first optical path and provides a first detector signal;
   providing a first polarizer in said first optical path between said laser diode and said first detector;
   providing a second detector that detects the optical power of light along said second optical path and provides a second detector signal;
   providing a bias compensation circuit that receives said first detector signal and said second detector signal and provides a bias current control signal, wherein said first detector signal corresponds to the optical power of polarized light along said first optical path, said second detector signal corresponds to the optical power of said light along said second optical path and said bias current control signal is determined based upon a ratio of said first detector signal relative to said second detector signal and a comparison of the ratio with respect to a predetermined bias signal; and
   providing a programmable bias current source that supplies said bias current to said laser diode, said programmable bias current source programmed by said bias current control signal of said bias compensation circuit so as to adjust said bias current to a predetermined value.

14. The method according to claim 13, wherein said providing a second detector that detects the optical power of light along said second optical path and provides a second detector signal comprises:
   providing said second optical path through a back facet of said laser diode; and
   integrally packaging said second detector with said laser diode.

15. The method according to claim 13, wherein said providing a first detector that detects the optical power of light along said first optical path and provides a first detector signal and providing a polarizer in said first optical path between said laser diode and said first detector comprises:
   providing said first optical path directed through a back facet of said laser diode; and
   integrally packaging said first polarizer and said first detector with said laser diode.

16. The method according to claim 13, further comprising:
   programming said bias current source such that said bias current supplied to said laser diode corresponds substantially with an operating threshold current of said laser diode.

17. The method according to claim 16, further comprising configuring said first polarizer to reduce light output of said laser diode when said bias current is substantially the same as or lower than said operating threshold current.

18. The method according to claim 13, wherein said providing a bias compensation circuit that receives said first detector signal and said second detector signal and provides a bias current control signal comprises:
   providing a divider that determines said ratio of said first detector signal relative to said second detector signal and provide a ratiometric signal; and
   providing a comparator that compares said ratiometric signal of said divider with said control signal and outputs said bias current control signal.

19. The method according to claim 18, wherein said providing a bias compensation circuit that receives said first detector signal and said second detector signal and provides a bias current control signal further comprises:
   providing a sample and hold circuit that samples said ratiometric signal during a calibration operation and holds said ratiometric signal during an imaging operation.

20. The method according to claim 18, further comprising setting said control signal to a value corresponding to approximately 0.7 times an output power of said light measured after said light has passed through said first polarizer divided by a measure current corresponding to said output of said light not passing through said first polarizer when said laser diode is operated substantially at its corresponding threshold current.

21. The method according to claim 13, further comprising aligning an axis of said first polarizer with said laser diode such that a maximum amount of power emitted from said laser diode is transmitted through said first polarizer when said laser diode is modulated on such that said laser diode emits laser light.

22. The method according to claim 13, wherein said first polarizer minimizes a power on said first detector when said laser diode is driven to emit a laser beam.

23. The method according to claim 13, further comprising proving a beam splitter in said first optical path between said first polarizer and said first detector so as to split polarized light along said first optical path into a third optical path that is directed to a photoconductive surface.

24. The method according to claim 13, further comprising providing a second polarizer in said second optical path between said laser diode and said second detector, said first polarizer aligned with a beam of said laser diode and said second polarizer aligned substantially orthogonal to said beam of said laser diode.

* * * * *